United States Patent
Chen

(10) Patent No.: US 7,696,841 B2
(45) Date of Patent: Apr. 13, 2010

(54) POWER AMPLIFIER UTILIZING QUADRATURE HYBRID FOR POWER DIVIDING, COMBINING AND IMPEDANCE MATCHING

(75) Inventor: Pin-Fan Chen, Fremont, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 655 days.

(21) Appl. No.: 11/166,674

(22) Filed: Jun. 23, 2005

(65) Prior Publication Data

US 2006/0290444 A1 Dec. 28, 2006

(51) Int. Cl.
*H04B 1/52* (2006.01)
*H01P 3/08* (2006.01)

(52) U.S. Cl. .................. 333/118; 333/128; 330/295

(58) Field of Classification Search ............ 333/117, 333/118, 128; 330/295, 124 R
See application file for complete search history.

(56) References Cited

U.S. PATENT DOCUMENTS

| 3,772,616 | A |  | 11/1973 | Imoto |  |
|---|---|---|---|---|---|
| 4,305,043 | A |  | 12/1981 | Ho et al. |  |
| 5,124,674 | A | * | 6/1992 | Dydyk et al. | ............... 333/110 |
| 5,304,961 | A |  | 4/1994 | Dydyk |  |
| 6,005,454 | A | * | 12/1999 | Kim | ........................... 333/128 |
| 6,128,479 | A | * | 10/2000 | Fitzpatrick et al. | .......... 455/137 |
| 6,552,634 | B1 | * | 4/2003 | Raab | .......................... 333/216 |
| 6,801,083 | B2 | * | 10/2004 | Ishigami et al. | ............... 330/52 |
| 6,970,039 | B2 | * | 11/2005 | Griffith et al. | ........... 330/124 R |
| 7,109,790 | B2 | * | 9/2006 | Kwon et al. | ............ 330/124 R |
| 7,180,372 | B2 | * | 2/2007 | Proehl | ........................ 330/295 |

FOREIGN PATENT DOCUMENTS

WO WO 03/065599 8/2003

OTHER PUBLICATIONS

ST, Start 420—NPN Silicon RF Transistor, Jul. 2002, 7 pages.*
ST, AN1438 Application Note—Low Noise Amplifier Optimized for Minimum Noise Figure at 1.9 GHz Using START420, Jun. 2001, 4 pages.*
A Low Distortion and High Efficiency Parallel-Operation Power Amplifier Combined in Different Phases in Wide Range of Load Impedances, by H. Ikeda, H. Kosugi and T. Uwano, IEEE Microwave Technologies and Techniques Symposium (MTT-S), pp. 535 to 538, 1996.

* cited by examiner

*Primary Examiner*—Dean O Takaoka

(57) ABSTRACT

A power amplifier includes a quadrature hybrid and input impedance matching network. The power amplifier also includes at least one amplifier that includes an output electrode, and a quadrature hybrid and output impedance matching network. The quadrature hybrid and input impedance matching network exhibits a low pass frequency response.

12 Claims, 5 Drawing Sheets

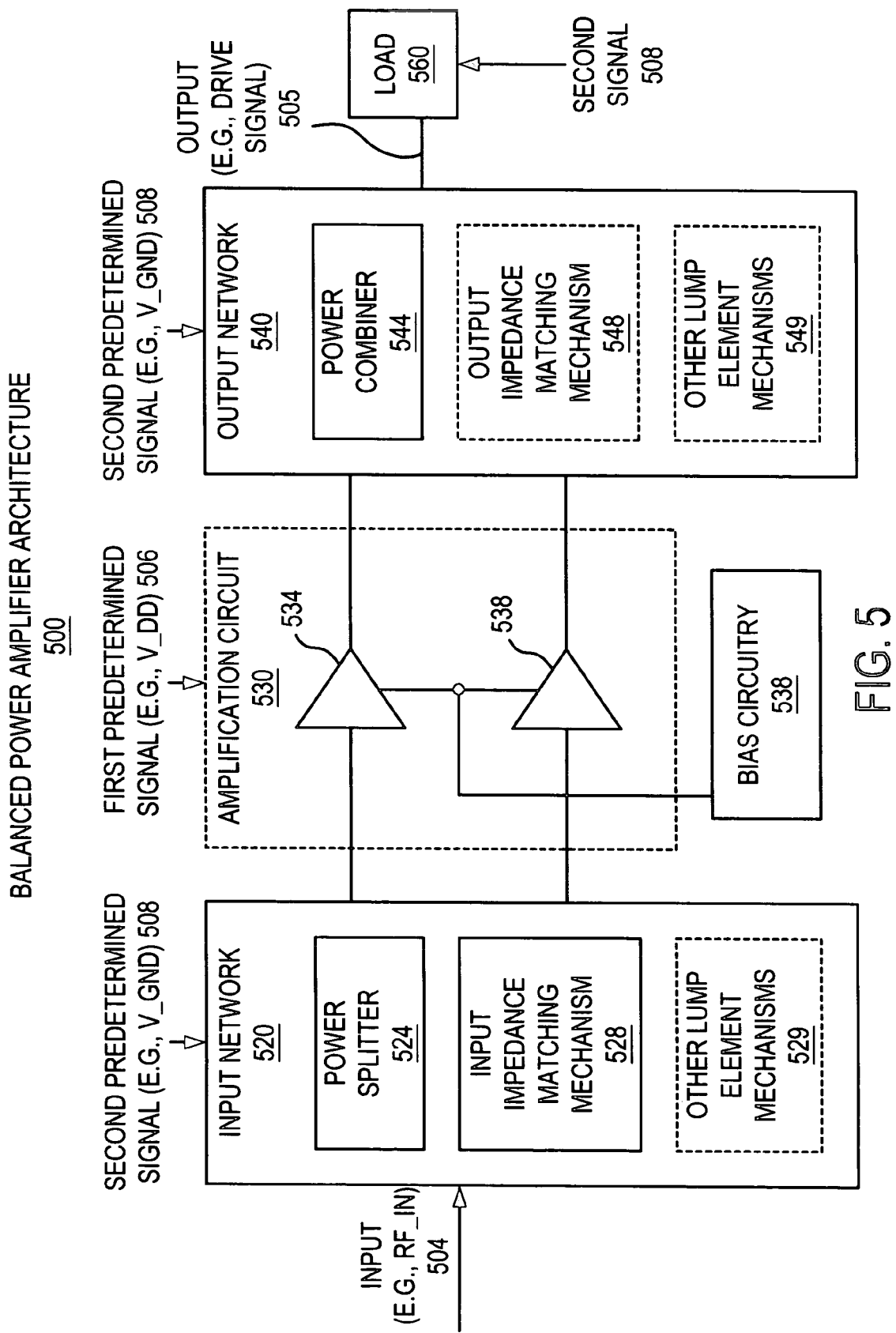

POWER AMPLIFIER UTILIZING QUADRATURE HYBRID FOR POWER DIVIDING, COMBINING AND IMPEDANCE MATCHING

BACKGROUND OF THE INVENTION

Handsets or cell phones are commonplace in society. The handsets are equipped with an antenna that sends outgoing signals and receives incoming signals. One important element in the handset is a power amplifier that is typically connected to the antenna. The power amplifier is utilized to receive signals (e.g., signals representing voice or sound) and to amplify these signals to a level suitable for transmission through the antenna. Cell phones typically operate at frequencies in the range between 1 GHz and 2 GHz.

Each country regulates the operating characteristics of handsets that are allowed to operate in that country. For example, many countries regulate the maximum amount of power that devices (e.g., handsets) are allowed to emit in adjacent channels (i.e., channels that are not the intended operating channel of the device). The amount of undesired or unwanted power emitted in adjacent bands is measured by using a ratio of the amount of power in the intended or specified channel divided by the amount of power emitted in channels adjacent to the intended channel, which is referred to as "adjacent channel power ratio" (ACPR). Each country can have an appropriate regulatory body specify the minimum acceptable ACPR for a device before approval of that device is granted.

The performance of the power amplifiers at the highest power output is dependent on the load impedance of an output transistor. Generally, it is desired that the amplifier operate in the linear region of operation, where the gain of the amplifier varies in a generally linear fashion. However, an unfavorable load impedance can cause the amplifier to operate in the saturation region that adversely affects or degrades the amplifier's performance. Unfortunately, this load condition is difficult to control in a wireless environment especially in the case of mobile communication because power reflected back to the antenna and the power amplifier can change the load impedance seen by amplifier, which in turn can adversely affect the performance of the amplifier. Specifically, power transmitted by the handset can be reflected back to the handset by the presence of metal objects in the environment (e.g., bars in a concrete wall beside a person placing the call) and eventually back to the amplifier, thereby affecting the load impedance.

One approach is to employ an isolator between the power amplifier module and the antenna to ensure a well-controlled impedance for the power amplifier. Unfortunately, this added component incurs both cost and space for mobile phone handsets. Furthermore, current isolator technology is incompatible with integrated circuit technology and packaging technology, thereby excluding the possibility of integrating the isolator with other components in the power amplifier. Consequently, the isolator is contrary to and militates against the trend to increase the functionality of electronic devices and components.

One approach to enable a power amplifier to accommodate a wide range of loads is described in "A Low Distortion and High Efficiency Parallel-Operation Power Amplifier Combined in Different Phases in Wide Range of Load Impedances," by H. Ikeda, H. Kosugi and T. Uwano, IEEE Microwave Technologies and Techniques Symposium (MTT-S), pages 535 to 538, 1996. Ikeda et al. propose the use of two or more power amplifiers with equal but phase-shifted signal paths. By diverting the reflected power into to different paths, where one of the paths includes a phase delay, the performance of the power amplifier may be improved. This approach is known as "balanced power amplifiers."

Unfortunately, the implementation proposed by Ikeda et al. uses 3 dB hybrids, Wilkinson combiners, and delay lines, that result in large physical sizes. Consequently, the large area required by the Ikeda implementation makes such an implementation unsuitable for miniature power amplifier modules that are utilized in may mobile telephone handset applications.

Stated differently, a primary disadvantage of this approach is that the approach requires components that are relatively large. Consequently, this approach is not conducive for space-efficient designs, which is the current trend. For example, as the handsets decrease in size or as more functions are integrated into the handsets, the space that is allocated to power management and control is rapidly decreasing.

Based on the foregoing, there remains a need for a mechanism to reduce the size or area occupied by the balanced power amplifier so that the balanced power amplifier can be utilized in miniature, space conserving applications and to further overcome the disadvantages set forth previously.

SUMMARY OF THE INVENTION

According to one embodiment of the present invention, a balanced power amplifier is provided. A power amplifier includes a quadrature hybrid and input impedance matching network. The power amplifier also includes at least one amplifier that includes an output electrode and a quadrature hybrid and output impedance matching network. The quadrature hybrid and input impedance matching network exhibits a low pass frequency response.

BRIEF DESCRIPTION OF THE DRAWINGS

The present invention is illustrated by way of example, and not by way of limitation, in the figures of the accompanying drawings and in which like reference numerals refer to similar elements.

FIG. 5 illustrates a block diagram of a balanced power amplifier according to a second embodiment of the invention.

DETAILED DESCRIPTION

A balanced power amplifier is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Power Amplifier 100 Architecture

Figure 1:
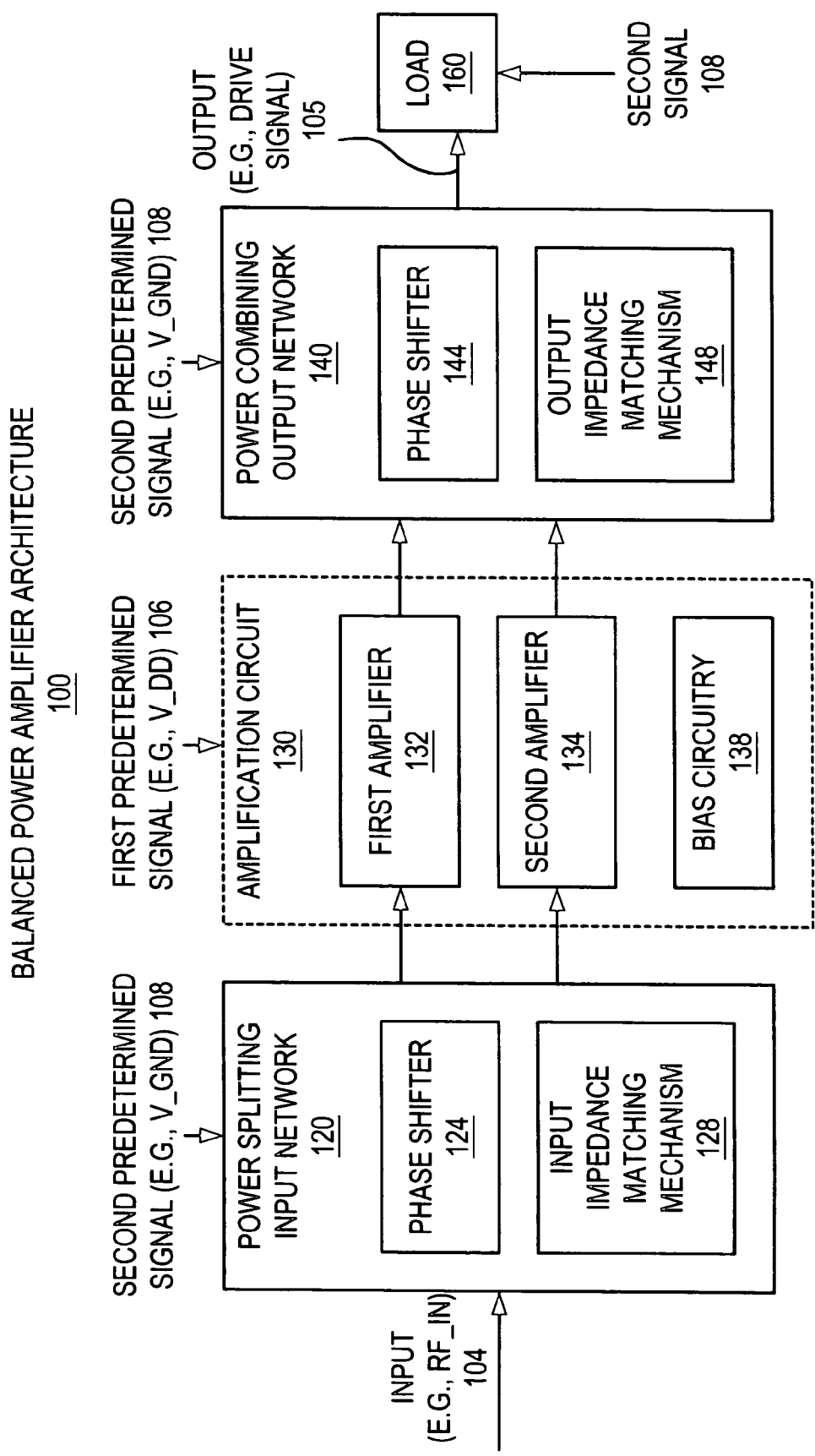
FIG. 1 illustrates a block diagram of a balanced power amplifier according to one embodiment of the invention.

FIG. 1 illustrates a block diagram of a balanced power amplifier according to one embodiment of the invention. The power amplifier 100 includes an input for receiving an input signal 104 (e.g., an RF signal, RF_in) and provides a drive signal 105 (e.g., a drive current) to a load (R_L) 160, which can be, for example, an antenna (e.g., a 50 ohm antenna).

The balanced power amplifier 100 includes a power splitter 120 (also referred to as a power divider) with integrated phase shifter 124 (also referred to as a phase delay mechanism). The power splitter 120 includes one input and two outputs. The input is coupled to receive the input signal 104. The first output of the power splitter 120 is coupled to a first signal path for a first signal, and the second output of the power splitter 120 is coupled to a second signal path for a second signal. The power splitter 120 divides the power of the received input signal between the first output signal and the second output signal generated on the first signal path and second signal path, respectively.

In one embodiment, the first signal in the first signal path that is shifted ninety degrees in phase from the second signal in the second signal path.

Optionally, the power splitter 120 can also include an integrated impedance transformation mechanism 128. In one embodiment, the phase shifter 124 includes a quadrature phase shifter that shifts the signal by ninety degrees. The power splitter 120 is also referred to herein as an impedance transforming, phase shifting, power splitting (ITPSPS) input network.

The power amplifier architecture 100 also includes an amplification circuit 130. The amplification circuit 130 includes a first amplifier 132 and a second amplifier 134. The first amplifier 132 includes an input that is coupled to the first signal path to receive the first signal. The second amplifier 132 includes an input that is coupled to the second signal path to receive the second signal. Bias circuitry 138 is provided to bias the amplifiers 132, 134. The amplifiers 132, 134 can be single stage amplifiers or a multi-stage amplifiers. In one embodiment, the amplifiers 132, 134 may be implemented with a field effect transistors (FETs), such as GaAs FETs.

The balanced power amplifier 100 includes a power combiner 140 with integrated phase shifter 144 (also referred to as a phase delay mechanism). The power combiner 140 includes two inputs and one input. The first input is coupled to receive the signal generated by the first amplifier 132. The second input is coupled to receive the signal generated by the second amplifier 134. The power combiner 140 combines the power of signal received by the first input with the power of the signal received by the second input and generates an output signal with the combined power.

The power combiner 140 is also referred to herein as an impedance transforming, phase shifting, power combining (ITPSPC) output network. The amplifier 134 can include one or more first field effect transistors (FET).

In one embodiment, the impedance matching function is integrated or combined with the power splitting function or power combining function, thereby reducing the overall size of the balanced power amplifier 100.

The space savings and space reduction provided by integrating or combining or more of the following functions: impedance matching function, the power splitting function, power combining function, phase shifting or phase delay or extinguishing of harmonics according to the invention enable balanced power amplifiers to be realizable in small handheld mobile handsets (e.g., cell phones).

These improvements in linearity can be measured in characteristics, such as gain variation and adjacent channel power ration (ACPR) in code division multiple access (CDMA) radios or wideband CDMA (WCDMA) radios.

In one embodiment, the balanced amplifier 100 is packaged in a module that includes a printed circuit board with different integrated circuits. The power splitter 120 is integrated with the amplification circuit 130 is integrated in single integrated circuit (IC), and the power combiner 140 is implemented in another integrated circuit. In an alternative embodiment, the power splitter 120 and the power combiner 140 are integrated with the amplification circuit 130 in a single integrated circuit. In yet another alternative embodiment, the power combiner 140 is integrated with the amplification circuit 130 in a single integrated circuit, and the power splitter 120 is implemented in a separate integrated circuit.

It is noted that one or more of the components or functions may be implemented as lumped elements or traces disposed on the printed circuit board, or as lumped elements disposed in one or more integrated circuit as described in greater detail hereinafter with reference to FIGS. 3 and 4. It is noted that the components may be packaged in a single integrated circuit or distributed across two or more integrated circuits.

It is noted that a first predetermined signal (e.g., V_DD signal) 106 and a second predetermined signal 108 (e.g., a ground signal) are provided to various components (e.g., the input network 120, the amplification circuit 130, and the output network 140) of the power amplifier 100. In one embodiment, the predetermined signal 106 is a power supply voltage signal that is in the range of about 1V to about 5V, and the second predetermined signal 108 is a ground potential signal.

Impedance Matching Quadrature Hybrid 200

Figure 2:
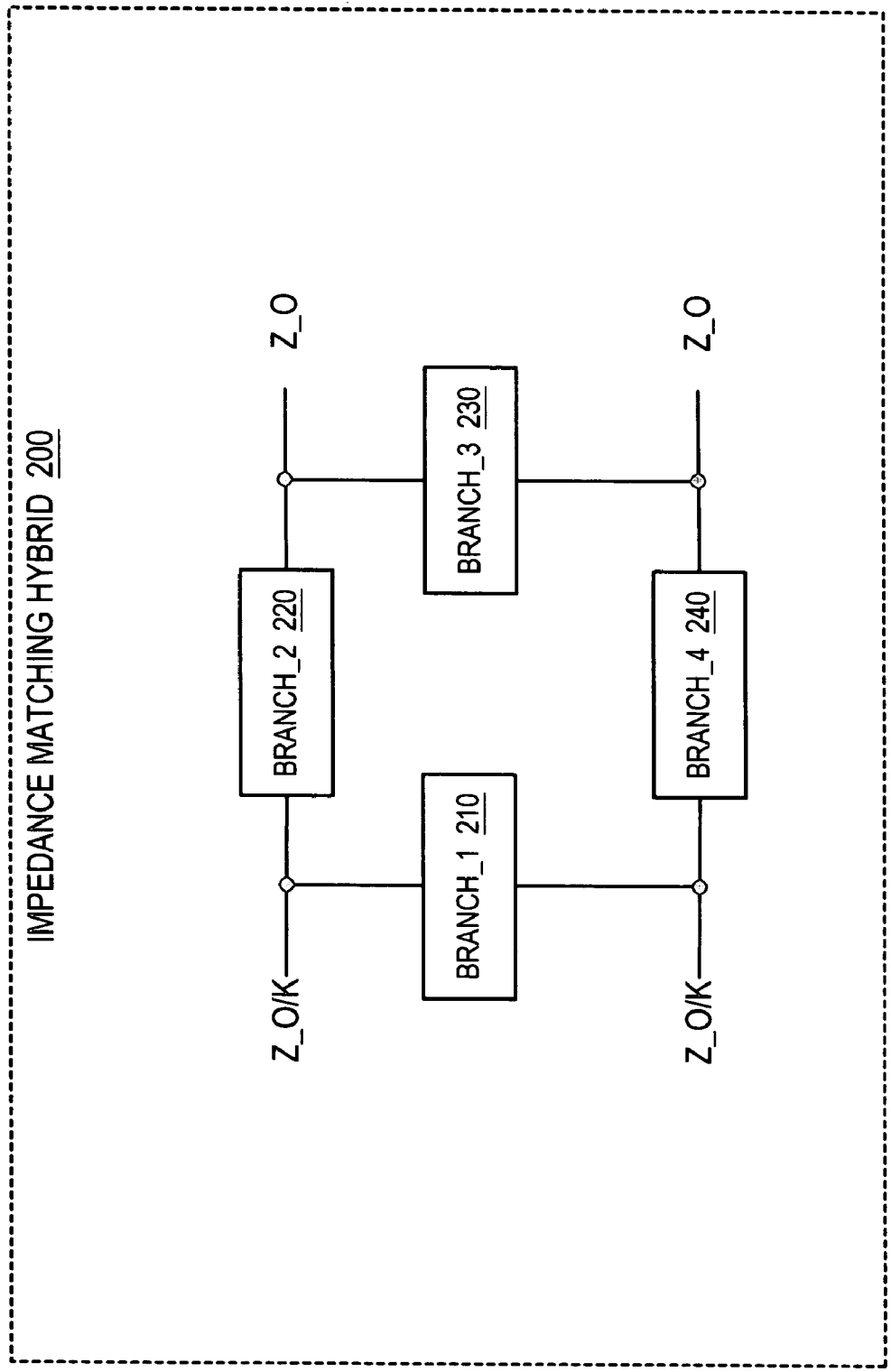
FIG. 2 illustrates in greater detail an impedance matching quadrature hybrid according to one embodiment of the invention.

FIG. 2 illustrates in greater detail an impedance matching quadrature hybrid 200 according to one embodiment of the invention. The impedance matching quadrature hybrid 200 includes a first branch (branch_1) 210, a second branch (branch_2) 220, a third branch (branch_3) 230, and a fourth branch (branch_4) 240.

The third branch 230 includes a circuit element that has an impedance of Z_o, where Z_o is the characteristic impedance of the load 160. In one embodiment, the load is a 50 ohm antenna, and Z_o is about 50 ohms. The first branch 210 includes a circuit element that has an impedance of Z_o/k, where Z_o is the characteristic impedance of the load (e.g., about 50 ohm) and k is a value that represents a relationship between the Z_o and the input impedance of the network. For example, the input impedance is an impedance that optimizes the amplifier's 132, 134 performance. In one example, a value of k is selected so that the input impedance can be about 10 ohms. In this case, k can be about 5. It is noted that the value of k may be adjusted to suit the particular requirements of the design of the amplifiers 132, 134. For example, the input impedance of the network may be selectively adjusted by adjusting the value of k so that the impedance seen by the output of the transistor maximizes the performance of the amplifier.

The impedance element can be implement by using a capacitor, inductor, a non-energy dissipating circuit element, or a combination thereof. The second branch includes an impedance element that has an impedance value given by the following equation: $Z\_o = (1/2k)^{0.5} Z\_IN$. Similarly, the fourth branch includes an impedance element that has an impedance value given by the following equation: $Z\_o = (0.5/k)^{0.5} Z\_IN$. For example, branch_2 and branch_4 needs to have a characteristic impedance of about 0.3 (50 ohms), which is about 15 ohms.

It is noted that the input network 120 or the output network 140 may be implemented by the impedance matching quadrature hybrid 200.

Impedance Transforming, Phase Shifting, Power Splitting/Combining Network: First Exemplary Lumped Element Implementation FIG. 3 illustrates a first exemplary lump element implementation of the impedance matching quadrature hybrid network 200 of FIG. 2 according to one embodiment of the invention. The impedance matching quadrature hybrid network 200 of FIG. 3 has a frequency response that exhibits a low pass behavior (i.e., low frequencies are allowed to pass through the network).

Figure 3:
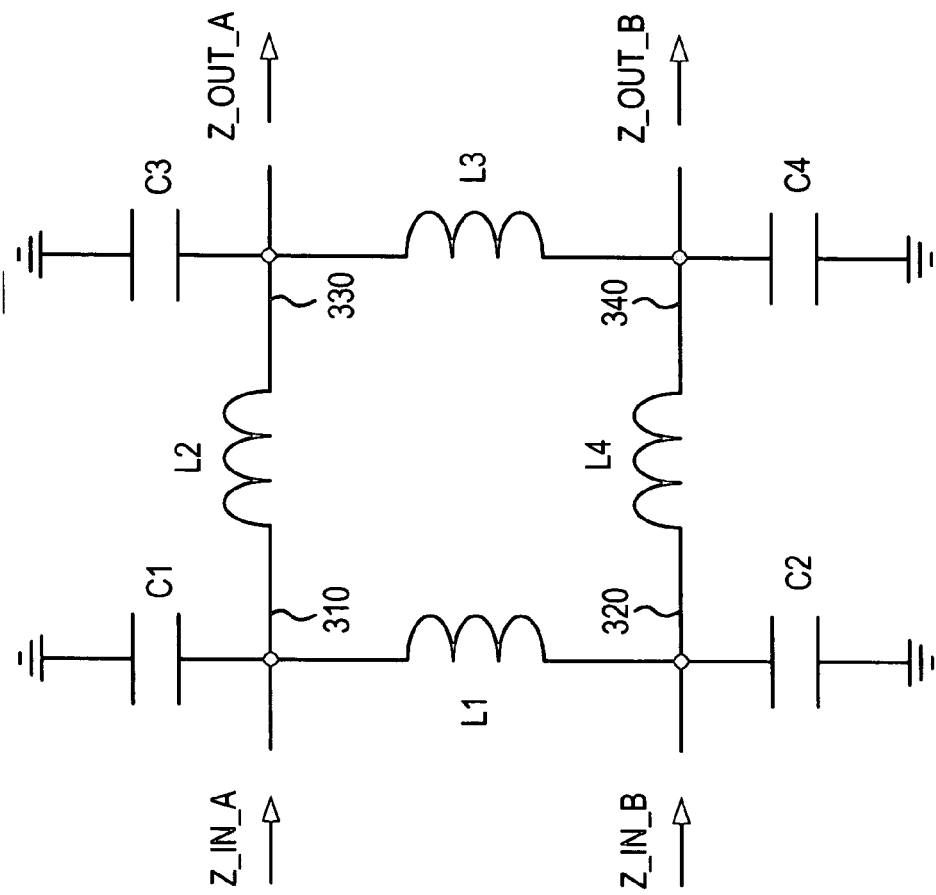
FIG. 3 illustrates a first exemplary lump element implementation of the impedance matching quadrature hybrid of FIG. 2 according to one embodiment of the invention.

The circuit diagram of the network 300 of FIG. 3 includes a plurality of nodes, capacitive elements, and inductive elements. The network 300 includes a first node 310, a second node 320, a third node 330 and a fourth node 340. Each node is coupled to a predetermined signal (e.g., a ground potential) through a respective capacitive element. For example, the first node 310 is coupled to a ground potential through a first capacitor C1. The second node 320 is coupled to a ground potential through a second capacitor C2. Similarly, the third node 330 is coupled to a ground potential through a third capacitor C3, and the fourth node 340 is coupled to a ground potential through a fourth capacitor C4. In one embodiment, the value of the first capacitor C1 is substantially equal to the value of the second capacitor C2, and the value of the third capacitor C3 is substantially equal to the value of the fourth capacitor C4.

The first node 310 is coupled to the second node 320 through a first inductive element L1. The first node 310 is also coupled to the third node 330 through a second inductive element L2. The third node 330 is coupled to a fourth node 340 through a third inductive element L3. Also, the second node 320 is coupled to the fourth node 340 through a fourth inductive element L4. In one embodiment, the value of the second inductor L2 is substantially equal to the value of the fourth inductor L4.

The impedance seen looking into the first node 310 and the second node 320 is referred to as the input impedance (Z_IN) of the network 300. The impedance seen looking into the third node 330 and the fourth node 340 is referred to the output impedance (Z_OUT) of the network 300.

It is noted that the capacitors in the network 300 have a self-resonance behavior due to their parasitic inductance. By selecting proper capacitance and parasitic inductance combinations, harmonic termination mechanisms that reduce or enhance the second harmonics or third harmonics may be realized. In one embodiment, the values for capacitors C1 and C2 may be selected to eliminate the second harmonics, and the value for capacitors C3 and C4 may be selected to eliminate the third harmonics. For example, when each of the capacitors C1 and C2 has a capacitance value of about 10 pF and a parasitic inductance value of about 0.15 nH, a resonance frequency of about 4 GHz is achieved, which is approximately twice or double the operating frequency for PCS (e.g., 1.9 GHz). Similarly, when each of the capacitors C3 and C4 has a capacitance value of about 6.2 pF and a parasitic inductance value of about 0.12 nH, a resonance frequency of about 5.8 GHz is achieved, which is approximately three times the operating frequency (e.g., 1.9 GHz). It is noted that the parasitic inductance of the capacitors may be selectively tuned to achieve a desired frequency. In this manner, the network according the invention reduces/enhances the second/third harmonics.

Impedance Transforming, Phase Shifting, Power Splitting/Combining Network: Second Exemplary Lumped Element Implementation FIG. 4 illustrates a second exemplary lump element implementation of the impedance matching quadrature hybrid of FIG. 2 according to a second embodiment of the invention. The impedance matching quadrature hybrid network 400 of FIG. 4 has a frequency response that exhibits a high pass behavior (i.e., high frequencies are allowed to pass through the network).

Figure 4:
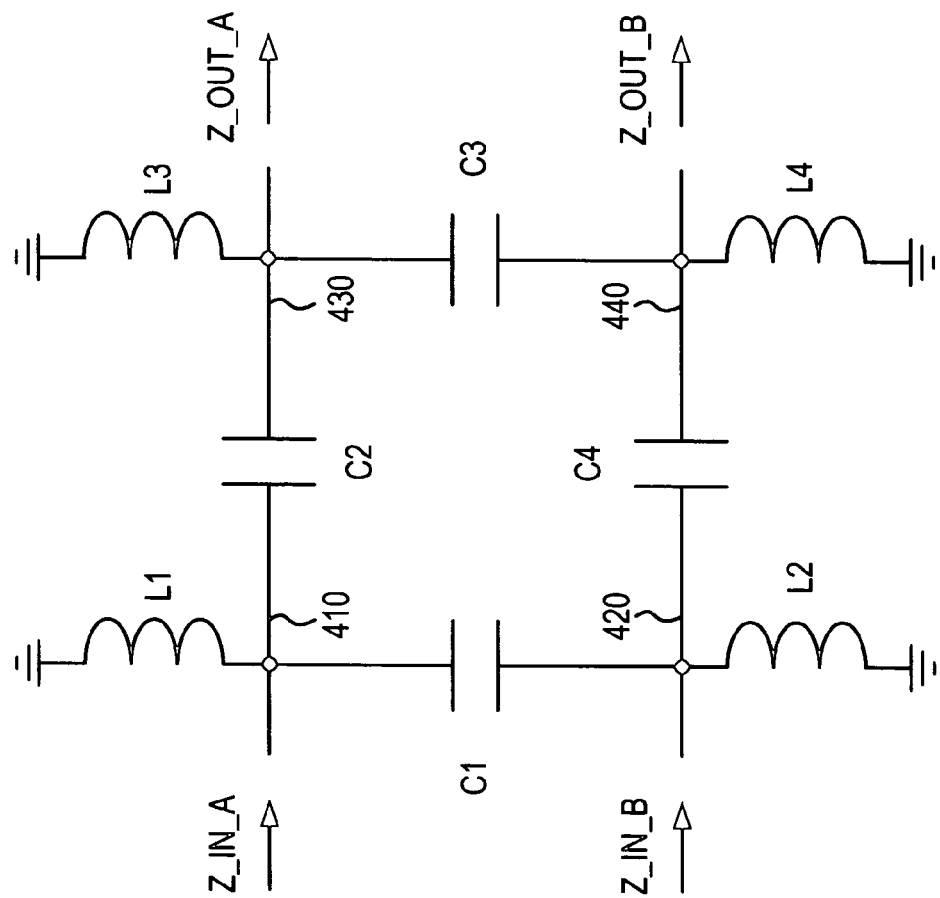
FIG. 4 illustrates a second exemplary lump element implementation of the impedance matching quadrature hybrid of FIG. 2 according to a second embodiment of the invention.

The circuit diagram of the network 400 of FIG. 4 includes a plurality of nodes, capacitive elements, and inductive elements. The network 400 includes a first node 410, a second node 420, a third node 430 and a fourth node 440. Each node is coupled to a predetermined signal (e.g., a ground potential) through a respective inductive element. For example, the first node 410 is coupled to a ground potential through a first inductor L1. The second node 420 is coupled to a ground potential through a second inductor L2. Similarly, the third node 430 is coupled to a ground potential through a third inductor L3, and the fourth node 440 is coupled to a ground potential through a fourth inductor L4. In one embodiment, the value of the first inductor L1 is substantially equal to the value of the second inductor L2, and the value of the third inductor L3 is substantially equal to the value of the fourth inductor L4.

The first node 410 is coupled to the second node 420 through a first capacitive element C1. The first node 410 is also coupled to the third node 430 through a second capacitive element C2. The third node 430 is coupled to a fourth node 440 through a third capacitive element C3. Also, the second node 420 is coupled to the fourth node 440 through a fourth capacitive element C4. In one embodiment, the value of the second capacitive C2 is substantially equal to the value of the fourth capacitive element C4.

The impedance seen looking into the first node 410 and the second node 420 is referred to as the input impedance (Z_IN) of the network 400. The impedance seen looking into the third node 430 and the fourth node 440 is referred to the output impedance (Z_OUT) of the network 400.

It is noted that the network 300 with the low frequency response (illustrated in FIG. 3) and the network 400 with the high frequency response (illustrated in FIG. 4) can be utilized in the input network 120 or the output network 140 of the amplifier 100.

The balance amplifier according to the invention can be realized as a module form. In this embodiment, the capacitors of the hybrids can be either integrated into the amplifier integrated circuit (IC) or separately realized as a passive integrated circuit. The inductors can be implemented with bond wires or as board traces (e.g., traces on a printed circuit board).

The value of capacitors can be selected to suit the requirements of a particular application. In one embodiment, values in the range of about 1 pF to 10 pF are utilized for PCS frequencies (e.g., 1900 MHz). In another embodiment, values in the range of about 2 pF to about 20 pF or greater are utilized for Cellular frequencies (e.g., 800 MHz to 900 MHz).

In one embodiment, the impedance matching mechanism is implemented with an impedance matching network that includes a plurality of shunt capacitors and a plurality of series inductors. For example, the plurality of series inductors can be implemented with a plurality of series of micro strip lines.

The impedance matching mechanisms (e.g., 128, 148) can include a plurality of shunt capacitors and a plurality of series inductors that may be implemented as thin and winding board traces on a printed circuit board.

FIG. 5 illustrates a block diagram of a balanced power amplifier according to a second embodiment of the invention. The amplification circuit 530 is implemented with a first power amplifier 534 and a second power amplifier 538. In this embodiment, the input network 520 and the output network 540 can be implemented with a quadrature hybrid that further includes one or more of the following circuits: second harmonic shorts and impedance matching networks. Consequently, the size of the amplifier is further reduced by this integration.

According to one embodiment of the invention, the power amplifier is implemented in a monolithic microwave integrated circuit (MMIC). According to another embodiment of the invention, the power amplifier is utilized in a code-division multiple access (CDMA) mobile handset. For example, the power amplifier according to the invention may be utilized in a code-division multiple access (CDMA) mobile handset that uses either Cellular mobile telephone frequencies or PCS mobile telephone frequencies.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A power amplifier comprising:
   a quadrature hybrid and input impedance matching network;
   at least one amplifier that includes an output electrode; and
   a quadrature hybrid and output impedance matching network, wherein the quadrature hybrid and input impedance matching network exhibits a low pass frequency response.

2. The power amplifier of claim 1 further comprising: bias circuitry that biases the amplifier.

3. The power amplifier of claim 1 wherein the quadrature hybrid and input impedance matching network includes
   a first node;
   a second node;
   a first branch that includes a first electrode coupled to the first node and a second electrode coupled to the second node;
   a third node;
   a second branch that includes a first electrode coupled to the first node and a second electrode coupled to the third node;
   a fourth node;
   a third branch that includes a first electrode coupled to the third node and a second electrode coupled to the fourth node; and
   a fourth branch that includes a first electrode coupled to the second node and a second electrode coupled to the fourth node.

4. The power amplifier of claim 1 wherein the quadrature hybrid and output impedance matching network includes
   a first node; a second node;
   a first branch that includes a first electrode coupled to the first node and a second electrode coupled to the second node;
   a third node;
   a second branch that includes a first electrode coupled to the first node and a second electrode coupled to the third node;
   a fourth node;
   a third branch that includes a first electrode coupled to the third node and a second electrode coupled to the fourth node; and
   a fourth branch that includes a first electrode coupled to the second node and a second electrode coupled to the fourth node.

5. The power amplifier of claim 1 wherein the quadrature hybrid and input impedance matching network is implemented with a plurality of lump elements.

6. The power amplifier of claim 1 wherein the quadrature hybrid and input impedance matching network exhibits a high pass frequency response.

7. The power amplifier of claim 1 wherein the quadrature hybrid and output impedance matching network is implemented with a plurality of lump elements.

8. The power amplifier of claim 1 wherein the quadrature hybrid and output impedance matching network exhibits a low pass frequency response.

9. The power amplifier of claim 1 wherein the quadrature hybrid and output impedance matching network exhibits a high pass frequency response.

10. The power amplifier of claim 1 wherein the power amplifier is implemented in a monolithic microwave integrated circuit (MMIC).

11. The power amplifier of claim 1 wherein the power amplifier is utilized in a code-division multiple access (CDMA) mobile handset.

12. The power amplifier of claim 1 wherein the power amplifier is utilized in a code-division multiple access (CDMA) mobile handset that employs one of Cellular mobile telephone frequencies and PCS mobile telephone frequencies.

* * * * *